United States Patent [19]

Matsuyama et al.

[11] 4,086,661

[45] Apr. 25, 1978

[54] CYLINDRICAL MAGNETIC DOMAIN ELEMENT

[75] Inventors: Shunsuke Matsuyama, Tokyo; Junichi Tanahashi, Yamato; Kenso Imamura, Yokohama; Teiji Majima, Komae, all of Japan

[73] Assignee: Fujitsu Limited, Kawasaki, Japan

[21] Appl. No.: 556,402

[22] Filed: Mar. 7, 1975

[30] Foreign Application Priority Data

Mar. 14, 1974 Japan .................................. 49-29387
May 9, 1974 Japan .................................. 49-51499

[51] Int. Cl.² ............................................ G11C 19/08
[52] U.S. Cl. ........................................ 365/39; 365/2; 365/8; 365/11; 365/12; 365/34; 365/43
[58] Field of Search ................... 340/174 TF, 174 SR

[56] References Cited

U.S. PATENT DOCUMENTS 3,689,901 9/1972 Bobeck .......................... 340/174 TF
3,699,551 10/1972 Fischer .......................... 340/174 TF

OTHER PUBLICATIONS

American Institute of Physics Conference on Magnetism and Magnetic Materials, Dec. 3–6, 1974; S.F. Cal. pp. 645–646.
IBM Technical Disclosure Bulletin–vol. 15, No. 8, Jan. 1973, p. 2649.
IBM Technical Disclosure Bulletin–vol. 15, No. 7, Dec. 1972, p. 2220.

*Primary Examiner*—James W. Moffitt
*Attorney, Agent, or Firm*—Staas & Halsey

[57] ABSTRACT

A cylindrical magnetic domain element is disclosed which utilizes a cylindrical magnetic domain (a magnetic bubble) produced by the application of a bias magnetic field to a magnetic sheet of orthoferrite, garnet or the like. Propagation patterns for the cylindrical magnetic domain are composed of a plurality of sets formed on one side of the magnetic sheet and have a multilayer construction with a non-magnetic film of SiO₂ or the like between the layers. This multilayer construction allows for the formation of a propagation pattern having a relatively narrow pattern gap. Further, the propagation pattern is disclosed as having uniaxial magnetic anisotropy, which facilitates the magnetic bubble propagation and ensures retaining of the magnetic bubble.

8 Claims, 35 Drawing Figures

PRIOR ART FIG. 1A
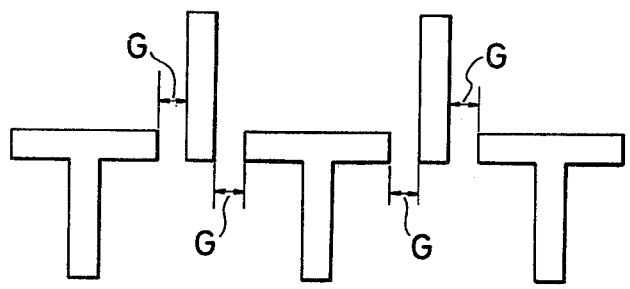
PRIOR ART FIG. 1B
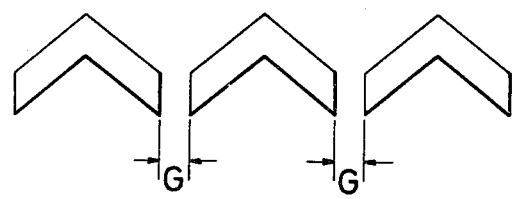
PRIOR ART FIG. 2
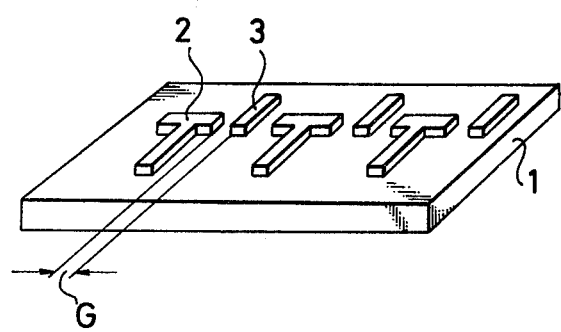

a a'  G = 1mm
b b'  G = 2mm
c c'  G = 3mm
d d'  G = 4mm

CYLINDRICAL MAGNETIC DOMAIN ELEMENT

BACKGROUND OF THE INVENTION

1. Field of the Invention

This invention relates to a cylindrical magnetic domain element, and more particularly to a cylindrical magnetic domain element having easily formed and highly efficient propagation patterns for cylindrical magnetic domains (magnetic bubbles).

2. Description of the Prior Art

When a sheet of orthoferrite, garnet or like monocrystalline or amorphous magnetic material having uniaxial magnetic anisotropy, which is grown or sliced in such a manner as to have a magnetic easy axis orthogonal with respect to the plane of the sheet, is exposed to a bias magnetic field orthogonal to the plane of the sheet (in the direction of the magnetic easy axis), a cylindrical magnetic domain (a magnetic bubble) is generated. This magnetic bubble moves according to a magnetic field gradient. This is described in detail in "Domain Behavior in Some Transparent Magnetic Oxides" by R. C. Sherwood, J. P. Remeika and H. J. Williams, Journal of Applied Physics, vol. 30, pages 215 to 225, 1959, and in "Properties and Devices Application of Magnetic Domain in Orthoferrites," Bell System Technical Journal, vol. 46, No. 8, page 1901 to 1925.

By taking advantage of the above said magnetic bubble characteristic (i.e., by detecting the presence or absence of the magnetic bubble in the form of binary information and by combining functions such as magnetic bubble generation, propagation, detection, erasure, division, etc. with one another), it is possible to construct a logic operation unit, a memory, etc. usable in a digital data processing unit.

A variety of conventional magnetic bubble propagation control methods are known. Of the conventional methods, one that has usually been employed is similar to that disclosed in U.S. Pat. Nos. 3,534,347 and 3,543,252. Those patents describe a method of forming propagation patterns of permalloy thin film in various shapes on one or both surfaces of a magnetic sheet and applying a rotating magnetic field parallel with the plane of the magnetic sheet to thereby effect propagation of the magnetic bubble.

Magnetic bubble propagation patterns are generally composed of T-I patterns, Y-I patterns, chevron patterns, or the like, formed of permalloy thin film. The formation of the propagation patterns is usually achieved by either directly depositing permalloy by vacuum evaporation on a magnetic sheet or is deposited on an abnormal magnetic bubble suppressing film, an $SiO_2$ film, a detecting pattern, a conductor pattern, an $SiO_2$ film, etc. formed on the magnetic sheet; then coating photoresist on the permalloy; exposing the photoresist to light through a mask having predetermined patterns; developing the patterns; selectively etching away the permalloy to form patterns of the permalloy film; and removing the remaining photoresist.

A propagation pattern formed in the above manner presents the following problems.

a) Pattern gap (the spacing between the patterns)

A decrease in the pattern gap increases the ease in magnetic bubble propagation. Namely, in the case of the propagation patterns as shown in FIG. 1A, which are each composed of a T pattern and an I pattern or in the case of the chevron patterns as shown in FIG. 1B, if the gap G between adjacent ones of the patterns is wide, a magnetic potential crest along the gap G is produced (as will be described later with regard to FIGS. 9A and 9B), which presents difficulty in magnetic bubble propagation. If the gap G is narrow, no magnetic potential crest is produced and magnetic bubble propagation is easy.

However, a conventional propagation pattern is illustrated in FIG. 2, wherein T and I patterns 2 and 3 are shown conventionally formed on a magnetic sheet 1. The T and I patterns 2 and 3 are simultaneously formed by means of etching in a conventional patterning process. Therefore, in order to sufficiently lessen the gap G, it is necessary to extremely enhance the accuracy of masking and etching. If the gap G is too narrow, the adjacent patterns tend to couple to each other and no magnetic bubble propagation function is obtained.

b) Magnetic poles

In the case of the T-I pattern, formed in the above manner, when a magnetic bubble lies at the center of the top of the T pattern, a retaining force due to configuration of the anisotropy is small. Therefore, where a driving magnetic field is stopped or is reduced in power so as to stop the magnetic bubble propagation operation and then reapplied so that the propagation operation is resumed, a propagation error is likely to occur.

For example, in FIG. 3, assuming that a rotating magnetic field in a direction of $a$–$b$–$c$–$d$ is applied and that a magnetic bubble is produced by a magnetic field $a$ on the T pattern at a position 4, the magnetic bubble is moved by a magnetic field $b$ to a position 5. Then, the magnetic bubble is moved by a magnetic field $c$ to a position 6 for the following reason. Since the magnetic field $c$ is opposite in direction to the magnetic field $a$, the polarity at the position 4 repels the magnetic bubble, while the polarity at the position 6 attracts the magnetic bubble. Then, the magnetic bubble is moved by a magnetic field $d$ to a position 7 on the I pattern. Also in this case, since the magnetic fields $d$ and $b$ are opposite in direction to each other, the position 5 has the polarity for repelling the magnetic bubble and the position 7 has the polarity for attracting the magnetic bubble. As described above, by the application of the magnetic fields $a$ to $d$, the magnetic bubble is propagated along the positions 4 to 7 on the propagation pattern.

When the magnetic bubbles exist at the positions 4, 6 and 7, if the rotating magnetic field is made zero, the magnetic bubbles are held at those positions by the retaining force due to configuration anisotropy. However, when the magnetic bubble lies at the position 5, if the rotating magnetic field is made zero, the retaining force due to configuration anisotropy becomes smaller than those at the positions 4, 6 and 7 and, as a result of this, the magnetic bubble is very likely to shift in the direction of the positions 4 or 6. When the magnetic field is made zero, if the magnetic bubble is not retained at the position 5 but shifts to the position 4 or 6, the magnetic bubble gets out of its reference phase and thereby provides erroneous information when the rotating magnetic field is applied again.

SUMMARY OF THE INVENTION

One object of this invention is to provide a magnetic domain element which enables the spacing between propagation patterns to be equivalently close to zero, and thereby facilitate magnetic bubble propagation.

Another object of this invention is to provide a magnetic domain element which can be easily fabricated, even if the pattern gap is reduced.

Another object of the present invention is to provide a magnetic domain element which ensures that the magnetic bubble is retained at a predetermined position during suspension of the magnetic bubble propagation operation.

Another object of this invention is to provide a cylindrical magnetic domain element in which propagation patterns of permalloy thin film are composed of a plurality of sets formed in separate layers on one surface of a magnetic sheet, with a non-magnetic film of $SiO_2$ interposed between the layers.

Still another object of this invention is to provide a cylindrical magnetic domain element which utilizes the configuration anisotropy and uniaxial magnetic anisotropy of propagation patterns.

BRIEF DESCRIPTION OF THE DRAWINGS

FIG. 1A is a diagram for explaining of the gap between T and I patterns;

FIG. 1B is a diagram for explaining the gap between chevron patterns;

FIG. 2 is a perspective view showing the T and I patterns;

DESCRIPTION OF THE PREFERRED EMBODIMENTS

Figure 3:
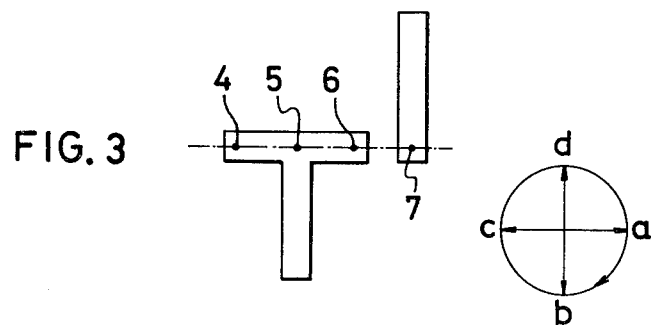
FIG. 3 is a diagram explanatory of the relationship between a rotating magnetic field and the position of a magnetic bubble in the T-I pattern.
Figure 4A:
FIGS. 4A to 4D, inclusive, are perspective views explanatory of the steps involved in the manufacture of the T-I pattern in accordance with one example of this invention.

FIGS. 4A to 4D are schematic diagrams, for explaining the construction of an example of this invention and the steps employed in its manufacture. In FIG. 4A, reference numeral 10 indicates a magnetic sheet, which is preferably a mono-crystal having uniaxial magnetic anisotropy such as orthoferrite, garnet or the like on an $SiO_2$ substrate. In this example, the magnetic easy axis is normal to the plane of the substrate.

Figure 4B:
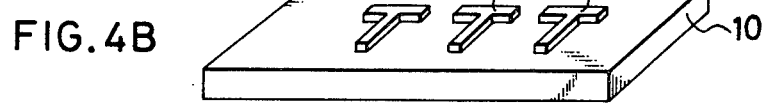
Figure 4C:
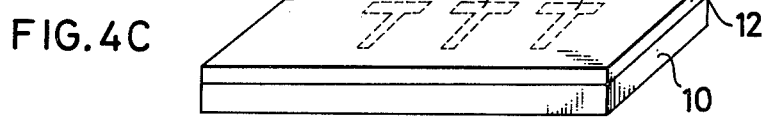
Figure 4D:
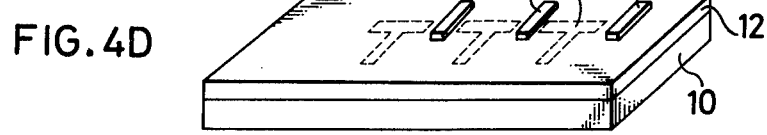

The T-I patterns are formed on the magnetic sheet 10. The patterns are divided into T and I patterns and the T and I patterns are individually formed as pattern segments. Namely, as shown in FIG. 4B, T pattern segments 11 are first on the magnetic sheet 10. A non-magnetic film 12, for example $SiO_2$, is formed over the surface of the magnetic sheet 10 to cover the T pattern segments 11, as depicted in FIG. 4C. Then, I pattern segments 13 are each formed on the non-magnetic film 12 corresponding to the area defined between adjacent ones of the T pattern segments 11, as shown in FIG. 4D. As a result of this, the T pattern segments 11 and the I pattern segments 13 are formed in layers insulated from each other by the non-magnetic film 12. With such a construction, even if the lateral spacing (gap) between the corresponding T and I patterns 11 and 13 is close to zero, they are not coupled with each other since the non-magnetic film 12 is interposed between the patterns.

Further, in the etching process employed for the formation of the respective T patterns and the I patterns, a relatively wide area is provided between adjacent ones of the T patterns 11 and between adjacent ones of the I patterns 13. These relatively wide areas are ultimately occupied by each of the I patterns 13 (or the T patterns 11) and this relaxes restrictions imposed on the accuracy of the making of an etching mask and that of the etching process.

In the alternative, it is possible to form the T patterns 11, on the non-magnetic film 12, after the formation of the I patterns 13 on the magnetic sheet 10.

Figure 5A:
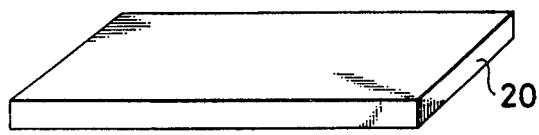
FIGS. 5A to 5D, inclusive, are perspective views explanatory of the steps used in the manufacture of the T-I pattern in accordance with another example of this invention.
Figure 5B:
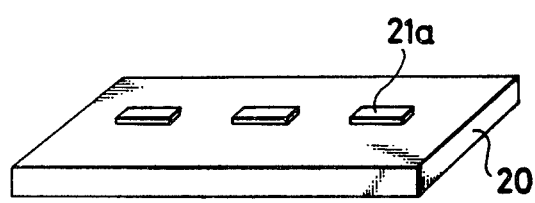
Figure 5C:
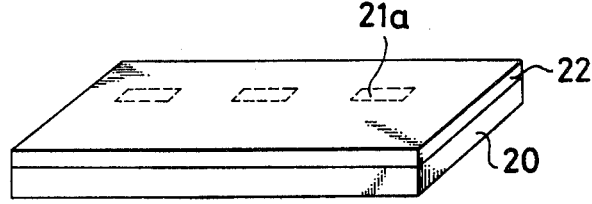
Figure 5D:
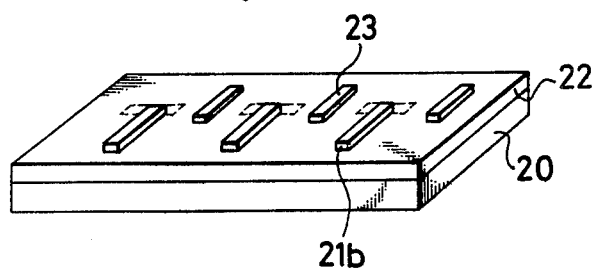

FIGS. 5A to 5D, inclusive, are explanatory of another example of this invention. In FIG. 5A, reference numeral 20 designates a magnetic sheet similar to that shown in FIG. 4A. In this case, the T patterns are broken up into pattern elements 21a and 21b. At first, the pattern elements 21a are formed on the magnetic sheet 20, as depicted in FIG. 5B, and a non-magnetic film 22 is coated over the magnetic sheet 20 to cover the pattern elements 21a, as shown in FIG. 5c. Then, the pattern elements 21b and the I patterns are formed on the non-magnetic film 22, as illustrated in FIG. 5D. The pattern elements 21a and 21b in pairs form individual T patterns and the pattern elements 21b and the I patterns 23 are identical in shape.

Figure 6:
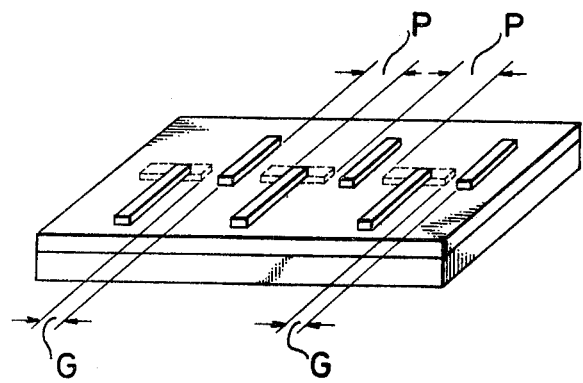
FIG. 6 is a perspective view explanatory of the pattern gap in the formation of the T-I pattern.

The propagation pattern gap, in the present example (FIG. 5D), is G, as is shown in FIG. 6, but the pattern gap during the pattern formation is P and bears such a relationship that $G<<P$. This relationship makes the formation of the patterns much easier than the formation of patterns in the prior art. As noted above, in the prior art, the propagation patterns are simultaneously formed in the same plane and the propagation pattern gap is the same as the pattern gap in the formation of the patterns. This prior art characteristic inherently presents difficulties when the intent is to lessen the propagation pattern gap.

Figure 7:
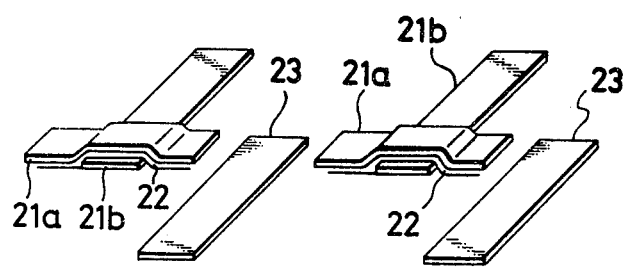
FIG. 7 is a perspective view illustrating another example of the T-I pattern according to this invention.
Figure 8:
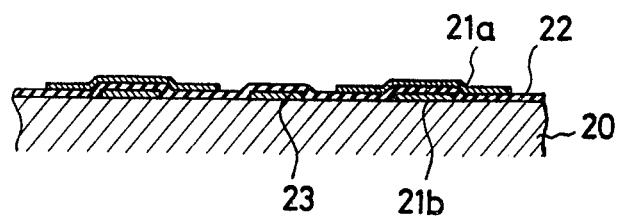
FIG. 8 is a cross-sectional view of the FIG. 7 example.

FIG. 7 illustrates, in perspective, another example of this invention in which the pattern elements 21b and the I patterns 23 are first deposited on the magnetic sheet 20, the non-magnetic film 22 of SiO$_2$ or the like is formed over the magnetic sheet 20 to cover the pattern elements 21b and the I patterns 23. The pattern elements 21a are then on the non-magnetic film 22. FIG. 8 shows, in section, the assembly of FIG. 7. Namely, the T patterns are each composed of the pattern elements 21a and 21b isolated from each other by the non-magnetic film 22. The non-magnetic film 22 is also interposed between the I patterns 23 and the pattern elements 21a of the T patterns.

Figure 9A:
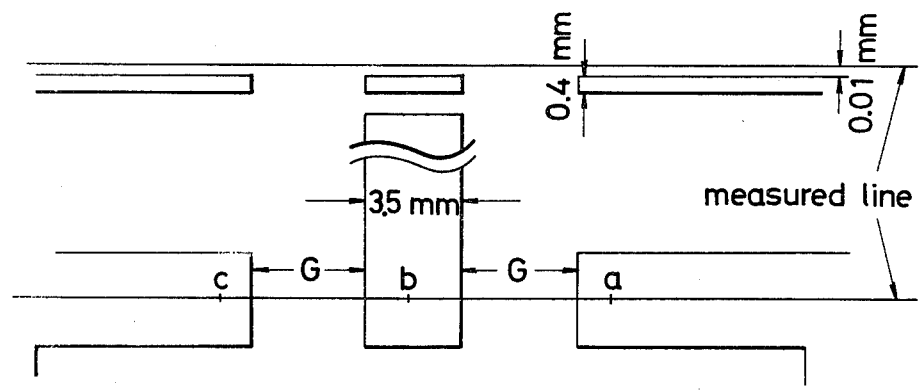
FIGS. 9A to 9c, are diagrams, for explaining the relationship between the propagation pattern gap and the magnetic field distribution.
Figure 9B:
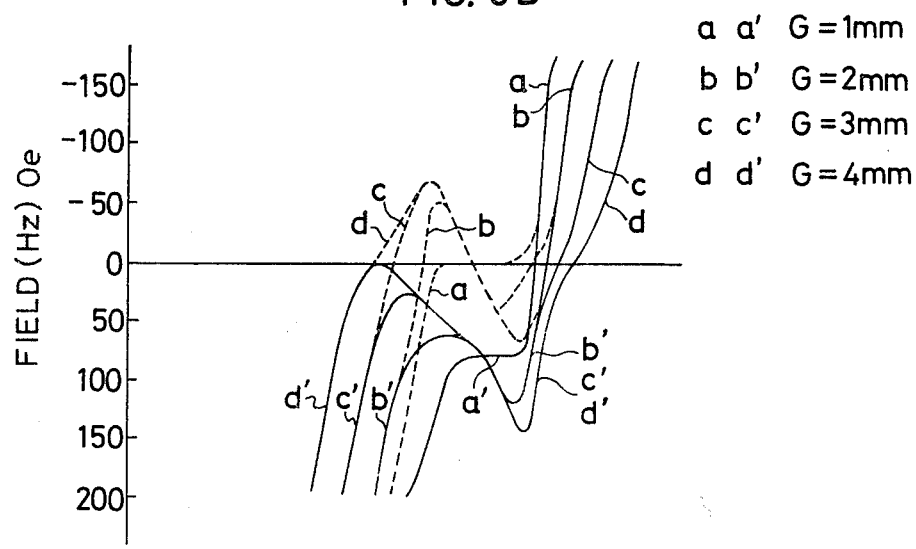
Figure 9C:
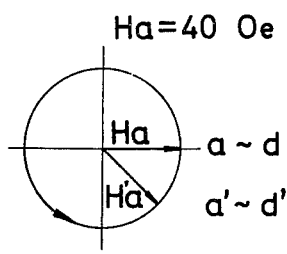

FIGS. 9A, 9B and 9C are diagrams, for explaining the relationship between the propagation pattern gap G and the magnetic field distribution. FIG. 9B shows measured results of the distribution of magnetic fields at respective points on a measuring line corresponding to the direction of a rotating magnetic field Ha when the gap G between the T and I patterns 0.4mm thick and 3.5mm wide as shown in FIG. 9A was changed in the range of 1 to 4mm. Namely, curves $a$ to $d$ and $a'$ to $d'$ respectively show magnetic field distributions in the gap G in the cases where the gap G was selected to be 1 to 4mm and the rotating magnetic field Ha was rotated to a horizontal direction Ha from a direction Ha' inclined at an angle of about 45° thereto, as shown in FIG. 9C. It appears from the graph of FIG. 9B that a decrease in the gap G makes the crests of the curves less sharp. This indicates that, as the gap G becomes narrower, the magnetic field necessary for the magnetic bubble transfer is reduced.

Thus, the gap G between the propagation patterns can easily be reduced in accordance with this invention. For example, in FIG. 6, even if the gap G is selected to be close to zero, since the gap P during the formation of the patterns is sufficiently wide, the formation of an etching mask and the etching process can be achieved with ease. Further, the presence of the non-magnetic film between adjacent patterns eliminates the possibility of coupling with each other.

Figure 10A:
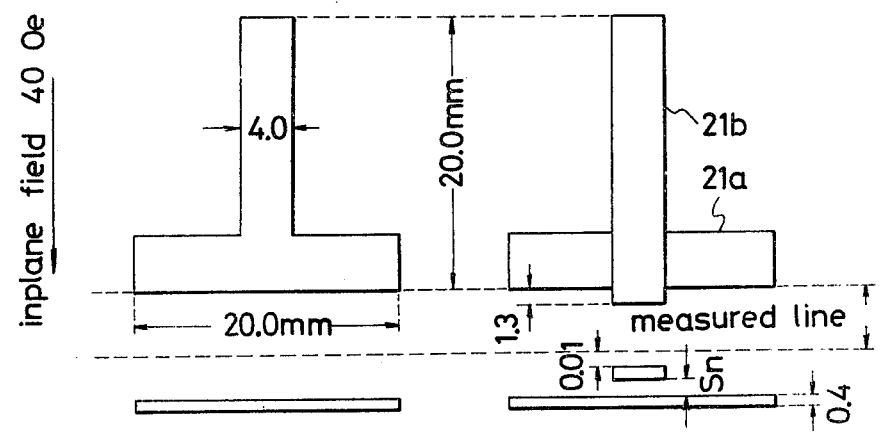
FIGS. 10A and 10B are diagrams, for explaining the magnetic field distribution in the case of forming the T pattern in a unitary structure and in the case of forming the T pattern with pattern elements, respectively.
Figure 10B:
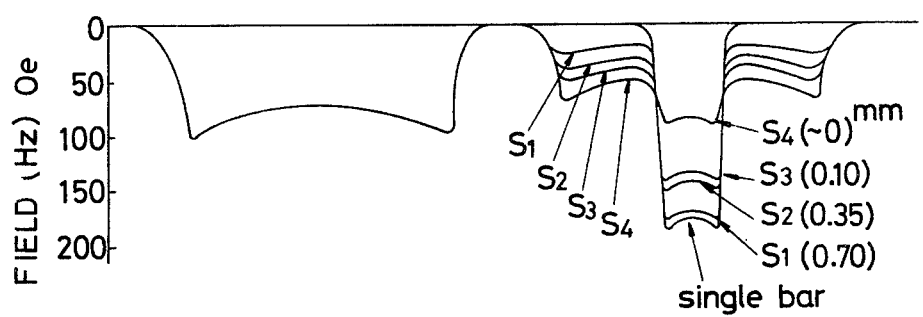

FIGS. 10A and 10B are explanatory of the magnetic field distribution in the case of forming the T pattern in a unitary structure and in the case of forming the T pattern with the pattern elements 21a and 21b, respectively. Reference character Sn indicates the thickness of the non-magnetic film interposed between the pattern elements 21a and 21b. Curves $S_1$ to $S_4$ in FIG. 10B indicate the respective cases where the thickness Sn of the non-magnetic film is selected to be 0.7mm, 0.35mm, 0.10mm and 0mm. A single bar indicates the case in which the T pattern comprises the pattern elements 21b and 21a. As seen from the curves in FIG. 10B, where the T pattern is composed of the pattern elements 21a and 21b and the non-magnetic film is formed therebetween, a magnetic bubble retaining force at the center of the top of the T pattern is increased, (i.e., at the tip of the pattern element 21b).

Figure 11:
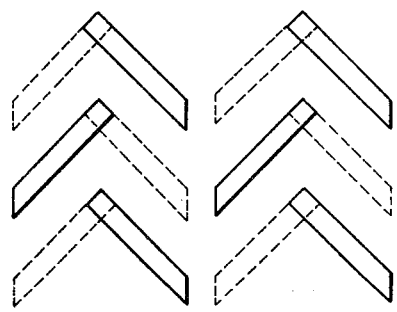
FIGS. 11 to 13 respectively illustrate examples of chevron patterns according to this invention.

FIG. 11 shows a multi-stage chevron pattern. Pattern elements shown in broken lines and in solid lines are formed in different layers separated by the non-magnetic film from each other (i.e., on and under the non-magnetic film, as is the case with the foregoing examples).

Figure 12:

FIG. 12 illustrates another example of this invention in which the chevron patterns are alternately formed in different layers with the non-magnetic film interposed therebetween, as indicated by broken and solid lines.

Figure 13:
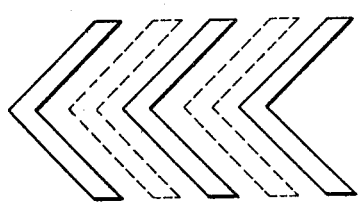

FIG. 13 also shows another example of this invention in which chevron patterns indicated by broken and solid lines are similarly formed alternately in different layers through the non-magnetic film.

Figure 14:
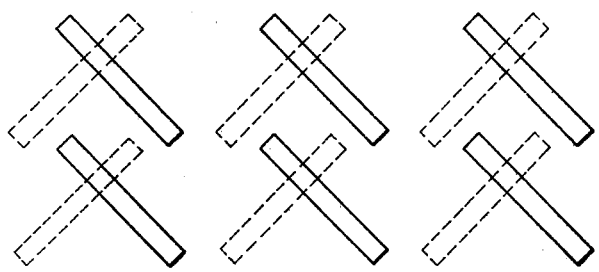
FIG. 14 shows X-X patterns produced in accordance with another example of this invention.
Figure 15:
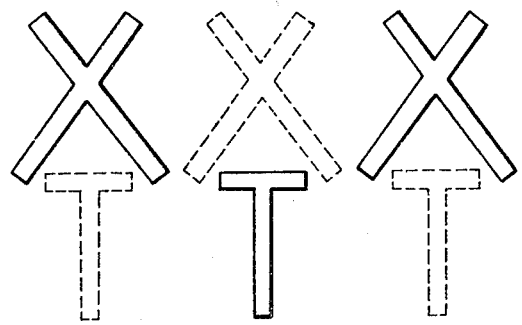
FIGS. 15 and 16 illustrate X-T patterns produced in accordance with other examples of this invention, respectively.
Figure 16:
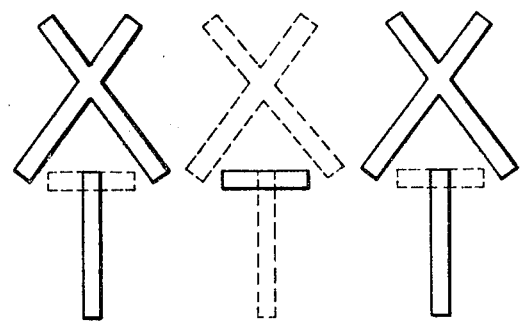
Figure 17:
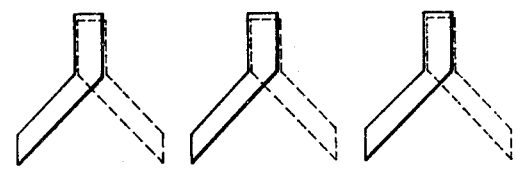
FIG. 17 shows Y-Y patterns produced in accordance with another example of this invention.
Figure 18:
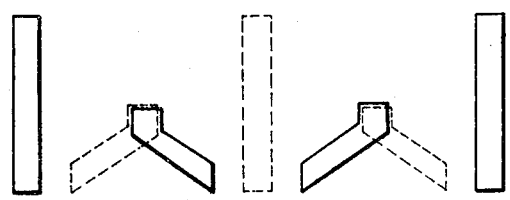
FIG. 18 shows Y-I patterns produced in accordance with another example of this invention.

FIG. 14 shows another example of this invention for X-X patterns and FIGS. 15 and 16 illustrate other examples of this invention for T-X patterns. FIGS. 17 and 18 show other examples of this invention for Y-Y and Y-I patterns, respectively. The patterns of broken and solid lines are formed in different layers with the non-magnetic film interposed therebetween.

Figure 19:
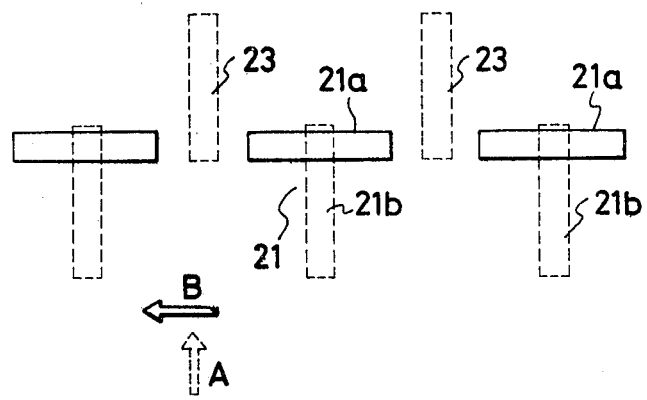
FIG. 19 illustrates another example of this invention in which the T-I pattern is given uniaxial magnetic anisotropy.

Further, by giving magnetic anisotropy to the magnetic film of permalloy forming the propagation pattern, magnetic bubble propagation and retaining characteristics can be remarkably enhanced. For example, as depicted in FIG. 19, the pattern elements 21b and 23 formed in a first layer are given uniaxial magnetic anisotropy in the direction of the arrow A and the pattern elements 21a formed in a second layer on the non-magnetic film are given uniaxial magnetic anisotropy in the direction of the arrow B. In this case, the direction in which the magnetic bubble is propagated by the rotating magnetic field is the direction of the pattern element 21a. Since the magnetic easy axis of the pattern element 21a is in agreement with the propagation direction, magnetic bubble propagation is very easy.

At the intersecting point of the pattern elements 21a and 21b since the non-magnetic film is formed between the pattern elements and since the magnetic easy axis of the pattern element 21b lies in its lengthwise direction, the magnetic bubble retaining force, in the case of the rotating magnetic field being shielded, is high due to interaction of the configuration anisotropy and the magnetic anisotropy. Accordingly, when the rotating magnetic field is applied again, erroneous information is not likely to be produced.

Where the I pattern 23 is given the uniaxial magnetic anisotropy in the direction of the arrow B, the magnetic bubble does not move along the I pattern which ensures propagation of the magnetic bubble.

Figure 20:
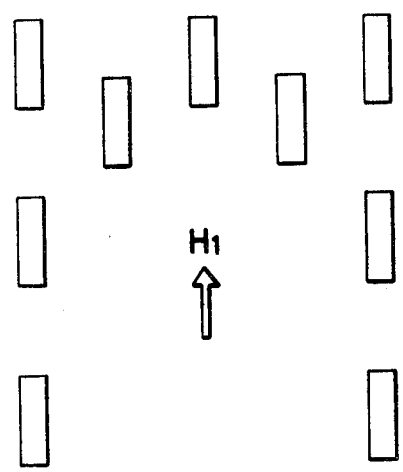
FIGS. 20 and 21 are schematic diagrams, for explaining the step employed for giving uniaxial magnetic anisotropy to the T-I patterns.
Figure 21:
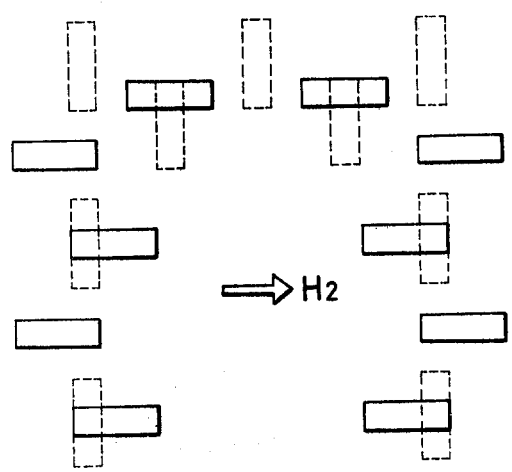

FIGS. 20 and 21 are schematic diagrams, for explaining the step for providing the uniaxial magnetic anisotropy in the lengthwise direction of the pattern. At first, permalloy is either directly deposited by vacuum evaporation in a magnetic field $H_1$ on a magnetic sheet of orthoferrite, garnet, or the like; or is deposited after the formation of an abnormal bubble suppression film, an SiO$_2$ film, a detection pattern, a conductive pattern, an SiO$_2$ film, etc. Then, one portion of the T pattern and one portion of the I pattern are formed by photoetching techniques. Since the lengthwise directions of these patterns are in the direction of the magnetic field $H_1$, the formed patterns have uniaxial magnetic anisotropy in that direction.

Then, a non-magnetic film, such as SiO$_2$ is formed over the magnetic sheet by means of sputtering, or the like. In this case, care should be taken not to raise the temperature because the uniaxial magnetic anisotropy of the pattern characteristically disappears at high temperatures.

Next, permalloy is deposited by vacuum evaporation on the non-magnetic film in a magnetic field $H_2$ and another portion of the T-I pattern is formed by photoetching techniques, as illustrated in FIG. 21. Since the lengthwise direction of this pattern agrees with the direction of the magnetic field $H_2$, the pattern has the uniaxial anisotropy in that direction. Consequently, the T pattern is composed of pattern elements having magnetic anisotropy orthogonal with respect to each other.

The Y-I, chevron and other patterns discussed above, may also be broken up into patterns extending in the same directions, be formed of pattern elements on one side of the non-magnetic film having uniaxial magnetic anisotropy in their lengthwise direction and pattern elements on one side of the non-magnetic film having uniaxial magnetic anisotropy in a different direction. There are some occasions when it is preferred to not provide uniaxial anisotropy in the lengthwise direction of the pattern element, but rather in another direction.

Figure 22:
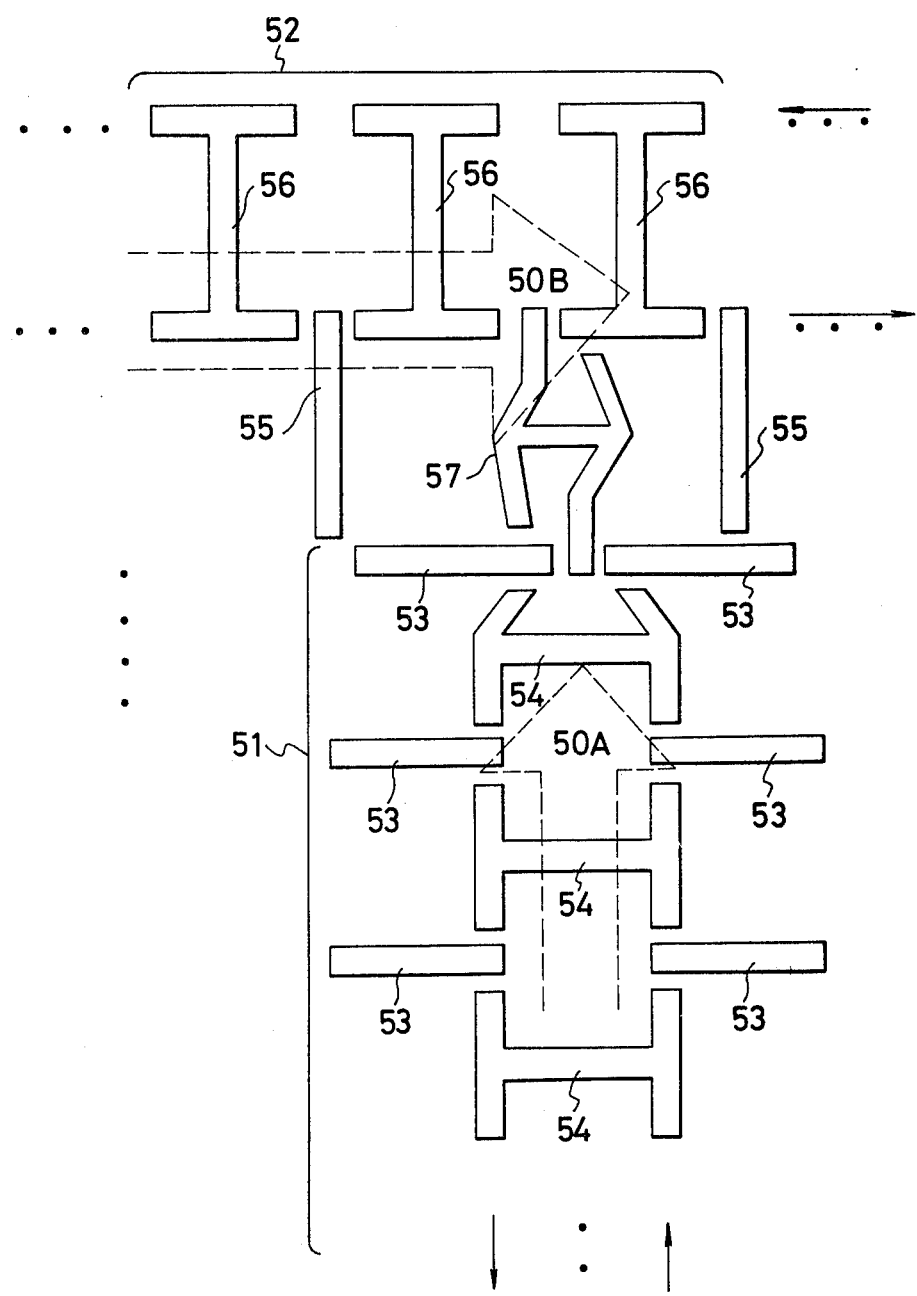
FIG. 22 shows another example of this invention which has a major loop and a minor loop.

FIG. 22 illustrates another example of this invention as being applied to a cylindrical magnetic domain element having a major-minor loop construction. A minor loop 51 is composed of I patterns 53 and T patterns 54 formed in a first layer and is given uniaxial magnetic anistorpy in the direction of a chain line arrow 50A. A major loop 52 is composed of I patterns 55 and T patterns 56 of a second layer and a transfer gate pattern 57 is also formed in the second layer. These patterns have uniaxial magnetic anisotropy in the direction of a broken line arrow 50B. The major loop 52 has disposed therein at appropriate positions a magnetic bubble generator and a magnetic bubble detector, though not shown. The magnetic bubble is propagated in the direction of the solid line arrow. The minor loop 51 is coupled with the major loop 52 through the transfer gate pattern 57. The magnetic bubble propagated into the major loop 52 is transferred to the minor loop 51, in which the magnetic bubble is moved in the direction of the full line arrow, thereby to effect storage of information. In the present example, since uniaxial magnetic anisotropy is provided in the direction of magnetic bubble propagation, magnetic bubble propagation is easy and unstable movement of the magnetic bubble can be suppressed.

Figure 23:
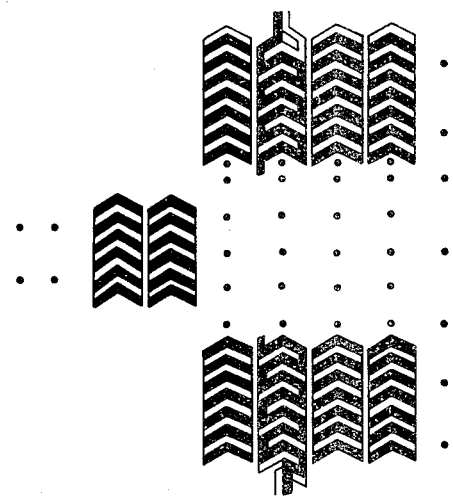
FIG. 23 illustrates an example of a sensor employing the chevron patterns.
Figure 24:
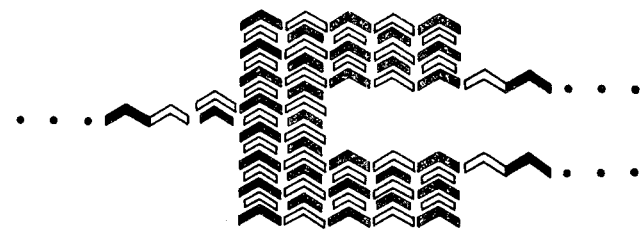
FIG. 24 shows an example of a replicator employing the chevron patterns.
Figure 25:
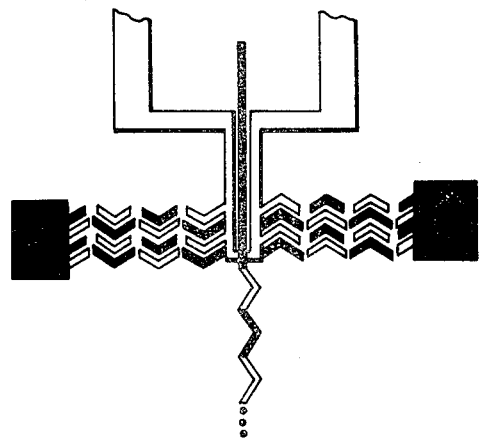
FIG. 25 illustrates an example of a nucleator employing the chevron patterns.

FIGS. 23, 24 and 25 show other examples of this invention as being applied to a sensor, a replicator and a nucleator, respectively, which employ chevron patterns. Black and white patterns are those formed in different layers isolated by the non-magnetic film from each other. The abovesaid sensor is composed of chevron patterns of upper and lower layers separated by the non-magnetic film formed therebetween and the gap between adjacent ones of the patterns is substantially zero, so that the sensor provides an output twice that obtainable with a conventional sensor of the same size as the former.

As has been described in the foregoing, in the present invention, the propagation patterns are broken up into a plurality of sets of patterns and the individual patterns are formed in layers on one side of a magnetic sheet while being separated by the non-magnetic film from each other, so that the pattern gap can be selected to be close to zero, and consequently the driving magnetic field can be reduced. Further, it is possible to obtain propagation patterns which enable easy propagation of a magnetic bubble as small as about 1 μm in diameter.

Moreover, in the formation of the propagation pattern, the spacing between pattern elements of each layer is larger than that between the propagation patterns to be ultimately obtained and the pattern elements can be formed by means of photoetching techniques. Even if no gap exists between the upper and lower patterns separated by the non-magnetic film from each other, the propagation patterns are not coupled with each other. Further, in the case where the T pattern is composed of pattern elements formed on and under the non-magnetic film, the magnetic bubble retaining force at the intersecting point of the pattern element increases. Where the pattern element is given uniaxial magnetic anisotropy, the magnetic bubble retaining force increases further. Where the propagation pattern is given uniaxial magnetic anisotropy in the magnetic bubble propagation direction, the magnetic bubble can be propagated with low magnetic field intensity.

It will be apparent that many modifications and variations may be effected without departing from the scope of the novel concepts of this invention.

What is claimed is:

1. A cylindrical magnetic domain element of a magnetic sheet material having a first surface with multi-layered propagation patterns thereon, in which a magnetic bubble is produced by the application of a bias magnetic field to said magnetic sheet, and is propagated by the application of a rotating magnetic field parallel with said first surface, in a direction corresponding to the direction of said rotating magnetic field along said propagation patterns formed of magnetic material films having uniaxial magnetic anisotropy, wherein:

said propagation patterns define at least first and second propagation pattern segments;

said first and second propagation pattern segments are defined in respective first and second layers of said magnetic films of said multi-layered propagation pattern; and a non-magnetic film separates said first and second layers of said multilayered propagation pattern.

2. A cylindrical magnetic domain element according to claim 1 wherein a T pattern is included which comprises straight line pattern segments formed in separate layers with a non-magnetic film interposed therebetween and each of said pattern segments has its uniaxial magnetic anisotropy in its lengthwise direction.

3. A cylindrical magnetic domain element comprising a magnetic sheet material having a first surface; and a multi-layered propagation pattern on said first surface; said multi-layered propagation pattern comprising a first layer of permalloy propagation pattern segments having uniaxial magnetic anisotropy, a second layer of permalloy propagation pattern segments having uniaxial magnetic anisotropy and a layer of non-magnetic material separating said first and second layers.

4. A cylindrical magnetic domain element as in claim 3, wherein said magnetic sheet material has uniaxial anisotropy with a magnetic easy axis normal to said first surface; said first layer of permalloy propagation pattern segments has uniaxial magnetic anisotropy in a first direction parallel to said first surface and said second layer of permalloy propagation pattern segments has uniaxial magnetic anisotropy in a second direction parallel to said first surface.

5. A cylindrical magnetic domain element as in claim 4, wherein said first and second directions are orthogonal.

6. A cylindrical magnetic domain element as in claim 3, wherein said non-magnetic material is $SiO_2$.

7. A cylindrical magnetic domain element as in claim 3, wherein said multi-layered propagation pattern is a T-I pattern; said segments in said first layer form said T pattern portions and said segments in said second layer form said I pattern portions.

8. A cylindrical magnetic domain element as in claim 3, wherein said multi-layer propagation pattern is a T-I pattern; a single one of said T portion of said T-I pattern comprises a first bar segment and a second bar segment, and a single one of said I portion of said T-I pattern comprises a single bar segment; said first layer comprises said first bar segment of said T portion and said single bar segment of said I portions; and said second layer comprises said second bar segment of said T portion.

* * * * *

UNITED STATES PATENT AND TRADEMARK OFFICE
CERTIFICATE OF CORRECTION

PATENT NO. : 4,086,661
DATED : April 25, 1978
INVENTOR(S) : Matsuyama et al

It is certified that error appears in the above-identified patent and that said Letters Patent are hereby corrected as shown below:

Column 1, line 27, "page" should be -- pages --;

Column 2, line 20, before "T-I" insert -- conventional --;

Column 3, line 45, "9c" should be -- 9C --;

Column 7, line 25, "anistorpy" should be -- anistropy --.

Signed and Sealed this

Thirty-first Day of October 1978

[SEAL]

Attest:

RUTH C. MASON
Attesting Officer

DONALD W. BANNER
Commissioner of Patents and Trademarks